(12) United States Patent
Kobayashi

(10) Patent No.: US 6,812,727 B2
(45) Date of Patent: Nov. 2, 2004

(54) SEMICONDUCTOR INTEGRATED CIRCUIT DEVICE AND TESTING METHOD THEREOF

(75) Inventor: Norifumi Kobayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/384,621

(22) Filed: Mar. 11, 2003

(65) Prior Publication Data

US 2003/0184336 A1 Oct. 2, 2003

(30) Foreign Application Priority Data

Mar. 11, 2002 (JP) ........................................ 2002-065025

(51) Int. Cl.$^7$ .............................................. G01R 31/26
(52) U.S. Cl. ........................................ 324/765; 324/763
(58) Field of Search ................................ 324/763–765, 324/158.1; 714/700, 733; 368/113–118; 327/152, 269

(56) References Cited

U.S. PATENT DOCUMENTS 6,057,691 A * 5/2000 Kobayashi .................. 324/617
6,219,305 B1 * 4/2001 Patrie et al. ................. 368/113

FOREIGN PATENT DOCUMENTS

JP 2001-91587 4/2001

* cited by examiner

*Primary Examiner*—Vinh P. Nguyen
(74) *Attorney, Agent, or Firm*—Oblon, Spivak, McClelland, Maier & Neustadt, PC (57) ABSTRACT

A semiconductor integrated circuit device comprises: a semiconductor substrate on which a semiconductor chip is provided; a plurality of phase comparators, provided on said semiconductor substrate, with input signals to said semiconductor integrated circuit from outside serving as one inputs thereof; and a variable delay circuit, provided on said semiconductor substrate, configured to adjust a timing of a reference clock signal which is used for a phase comparison; wherein distributed reference clock signal signals into which the reference clock signal is distributed so as to reach at the same time said plurality of phase comparators, are set as the other inputs of said phase comparators.

9 Claims, 7 Drawing Sheets

SEMICONDUCTOR INTEGRATED CIRCUIT DEVICE AND TESTING METHOD THEREOF

CROSS REFERENCE TO RELATED APPLICATION

This application is based upon and claims the benefit of priority from the prior Japanese Patent Application No. 2002-65025, filed on Mar. 11, 2002; the entire contents of which are incorporated herein by reference.

BACKGROUND OF THE INVENTION

The present invention relates to a testing method at a high timing accuracy in the case of performing a test for selecting acceptable and unacceptable semiconductor integrated circuit devices (LSI) when evaluating characteristics thereof and mass-producing these devices. The present invention also relates to a semiconductor integrated circuit device applied to an adjustment of a timing skew, at a test signal interface with an exterior of the semiconductor integrated circuit device, a signal from a semiconductor testing apparatus etc. to a semiconductor integrated circuit Device Under Test (which will hereinafter be abbreviated to DUT) or a signal from the DUT to the semiconductor testing apparatus etc.

Over the recent years, in a test environment for judging in an evaluation test and in a mass-production test whether the higher-speed semiconductor integrated circuit is acceptable or unacceptable, there have been increasingly high demands for improving a timing accuracy of an input signal applied to the DUT and an output signal from the DUT. What requires a high accuracy is typically a high-speed interface circuit, an MPU executing clock signal-multiplication in internal PLL/DLL, a chip-to-chip/board-to-board high-speed data transfer and receipt, and so on.

Then, in the case of testing this type of semiconductor integrated circuit device at a real speed, there arises a problem that a timing skew between the signals in the semiconductor testing apparatus etc. is not allowable.

A first conventional method executed for obviating this problem is that calibration data up to a test head end included in the semiconductor testing apparatus as a system are corrected by use of electric wiring length data of a device board that is measured directly by an oscilloscope or by a TDR (Time Domain Reflectometry) measurement. The skew calibration up to the DUT end can be thereby attained.

The first conventional method is a method that has hitherto been widely generally conducted, but does not reach the timing accuracy demand level described above in terms of the timing accuracy. A reason for this is that timing data obtained by arithmetically calculation is not coincident with timing data obtained in an actual resting state where the semiconductor testing apparatus is actually connected to the device board. In this case, the timing data is calculated using electric wiring length measured in a way that propagates a signal at, for example, a test head end directly or up to a different measurement unit and an electric wiring length measured by use of an external measuring device such as the oscilloscope etc. as a single device board.

The main cause thereof is, it is considered, derived from discordance between an input waveform at the test head end and an input waveform when measuring by the single device board in the case of measuring by propagating the signal at the test heat end directly or up to the different measurement unit, and from mismatching of impedance at a connection point between the test head end and the device board.

A second conventional method is a calibration at the DUT end and involves performing a manual probing measurement using an external measuring device serving as a basis and a measurement in an automatic probing system. The second conventional method schemes to actualize a higher calibration than by the first conventional method described above.

If the number of pins increases in the manual probing, however, the precise probing that ensures a reproducibility can not be attained in such an environment that the worker properly replaces it at a site of the mass-production.

A third conventional method is a measurement using a short-circuiting device or a measurement of the electric wiring length based on the TDR method using an open-circuiting device. This method utilizes a reflection in a case where a signal transmitted with a fixed characteristic impedance showing zero or infinity of the characteristic impedance at the DUT end.

Those methods have a problem in which a fine adjustment of the characteristic impedance is, of course, hard to execute in the case of making the fine adjustment thereof on a transmission path as frequently done by a high-speed device, and an essentially required electric wiring length only on an outgoing path or a returning path because of different inclinations, different qualities and different frequency components of the signal waveforms on the outgoing path and the returning path.

SUMMARY OF THE INVENTION

According to one aspect of the invention, there is provided a semiconductor integrated circuit. device comprising:

a semiconductor substrate on which a semiconductor chip is provided;

a plurality of phase comparators, provided on said semiconductor substrate, with input signals to said semiconductor integrated circuit from outside serving as one inputs thereof; and a variable delay circuit, provided on said semiconductor substrate, configured to adjust a timing of a reference clock signal which is used for a phase comparison;

wherein distributed reference clock signal signals into which the reference clock signal is distributed so as to reach at the same time said plurality of phase comparators, are set as the other inputs of said phase comparators.

DETAILED DESCRIPTION OF THE INVENTION

Embodiments of the present invention will hereinafter be described with reference to the accompanying drawings.

To start with, a first embodiment will be explained referring to FIGS. 1 and 2.

Figure 1:
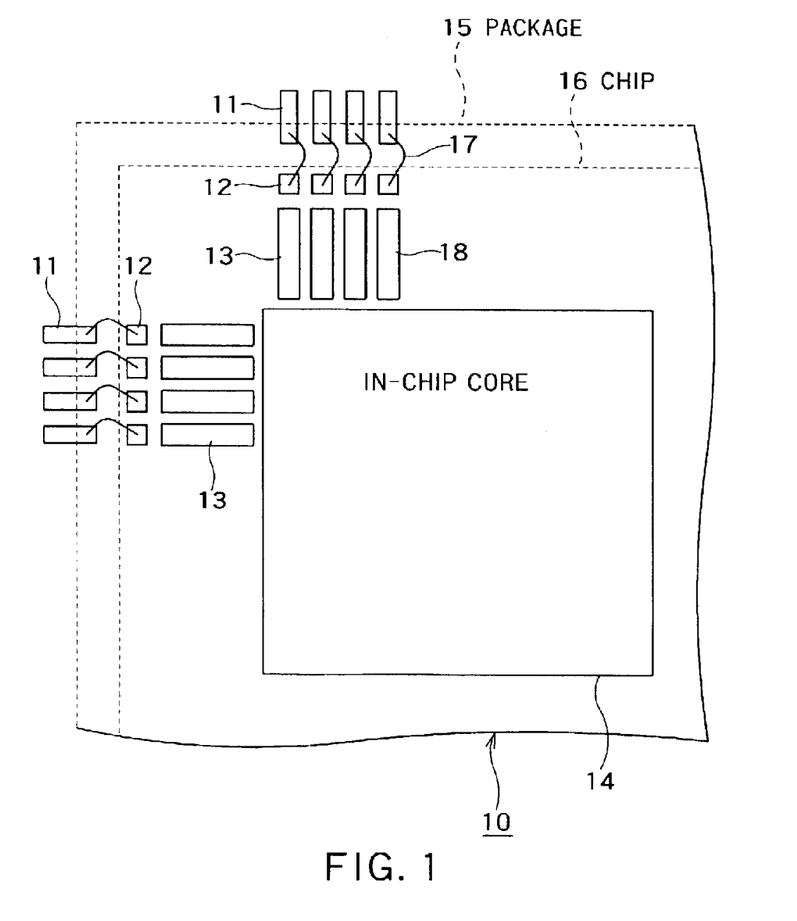
FIG. 1 is an explanatory plan view showing an interior of a package of a semiconductor integrated circuit device to which the present invention is applied.

FIG. 1 is a schematic plan view showing an inside view of a basic structure of a semiconductor integrated circuit device as a DUT. The embodiments of the present invention will be applied to this basic structure. FIG. 2 is a conceptual plan view of an I/O section of the semiconductor integrated circuit device according to the first embodiment of the present invention.

Referring to FIG. 1, a semiconductor integrated circuit device under test (which will hereinafter be simply called a device under test (DUT)) has a chip composed of semiconductor material such as silicon etc. and a molded package that seals this chip. Specifically, chip 10 is covered with a molded package 15 composed of a resin sealing member.

The chip 10 has an in-chip core including such as a memory circuit and a random logic circuit in a central area. In peripheral area 16 of the chip 10, a plurality of I/O pads 12 and I/O buffers 13 electrically connected respectively to the I/O pads 12. Disposed also are external terminals 11 partially exposed from the surface of the package 15 covering the chip 10 and electrically connected to the semiconductor integrated circuit. The external terminals 11 and the I/O pads 12 are electrically connected to each other through bonding wirings 17 composed of Al or Au, which are covered with the package 15.

The DUT transfers and receives signals to and from an external system and supplied with the electricity through these external terminals 11. What this embodiment of the present invention aims at is a timing of time about transferring and receiving the signals, and therefore a discussion on a single line will hereinafter be made.

The electrical connection is established in this sequence: the external terminals 11 - - - the pads 12 - - - the I/O buffers 13 - - - the in-chip core 14, wherein an input signal, after a normal voltage signal has been applied to this input signal from outside, passes through the route described above and is finally supplied to the in-chip core. On the other hand, an output signal, after undergoing a logical process in the in-chip core 14, passes through the pads 12 from the output buffers 13 and is supplied to the external system outside the DUT.

Figure 2:
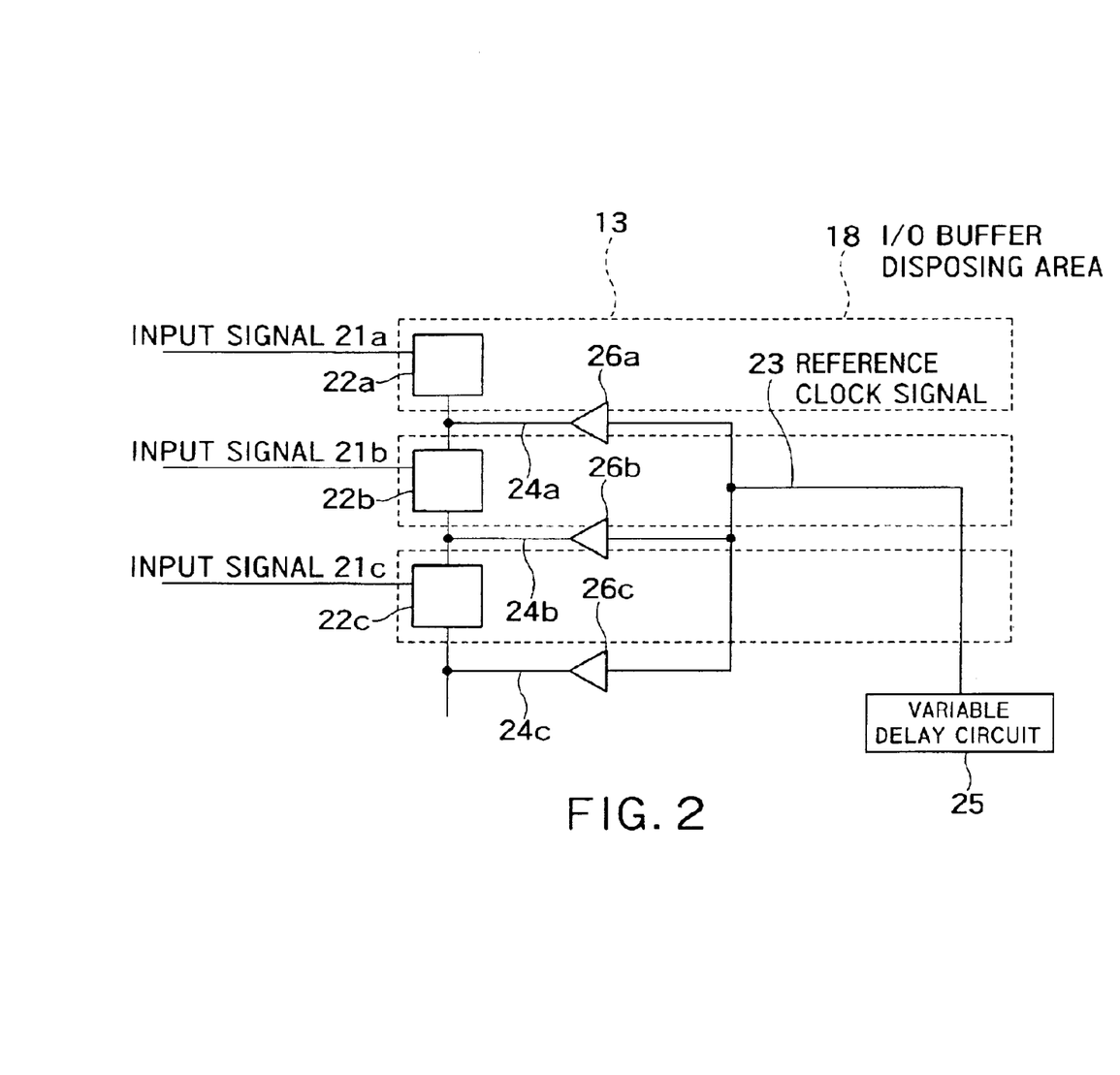
FIG. 2 is a conceptual plan view showing an I/O section of the semiconductor integrated circuit device in a first embodiment of the present invention.

As shown in FIG. 2, according to the first embodiment of the present invention, an area (an I/O buffer disposing area) 18 for with the I/O buffers 13 includes, in addition to a circuit serving as a normal I/O function, phase comparators 22a, 22b, 22c, ... for comparing phase timings of two pieces of signals with each other. These comparators 22a, 22b, 22c, ... measure a timing skew between a reference clock signal defined as a timing fiducial for the phase comparison and each of a plurality of input signals 21a, 21b, 21c, ... Each of the phase comparators 22a, 22b, 22c is generally constructed of a flip-flop in which any one of the input signals 21a, 21b, 21c, ... is set as a data input while the reference clock signal is set as a clock signal input, or of a phase detector, a differential comparator etc. wherein any one of the input signals 21a, 21b, 21c, ... and the reference clock signals are set as inputs. Note that the configuration of the phase comparator of the present invention is not limited to only what is shown in the first embodiment.

Each of the phase comparators 22a, 22b, 22c includes a first input for inputting the applied signal to each in-chip core, and a second input for inputting the reference clock signal.

Further, the chip 10 is provided with a variable delay circuit 25 for arbitrarily adjusting the reference clock signal which is used as standard for the phase comparison and the timing of the reference clock signal. This variable delay circuit 25 is disposed in an arbitrary position of the central area where the in-chip core 14 is provide, or the peripheral area 16 etc. on the chip 10. Wirings are provided between the variable delay circuit 25 and second inputs of each of the phase comparators 22a, 22b, 22c. A reference clock signal 23 with its timing being arbitrarily adjusted, is outputted from the variable delay circuit 25 and provided as distributed reference clock signal signals 24a, 24b, 24c to phase comparators 22a, 22b, 22c via these wirings.

Each distributed reference clock signal, for example, 24a is supplied using the wiring so that it is inputted to, for example, two pieces of phase comparators 22a and 22b.

Note that the buffers 26a, 26b, 26c are inserted in the wiring in the first embodiment but does not affect a circuit function. Accordingly, this buffer may not be inserted, or a plurality of buffers may also be inserted therein.

Note that in the first embodiment, the phase comparators 22a, 22b, 22c are disposed in the I/O buffer disposing area 18, but they can be also disposed in whatever position on the chip. Hence, the phase comparator 22 may be provided and disposed in an arbitrary area having a room on the chip.

Next, an actual operation will be explained.

A timing correction circuit (not shown), built in a semiconductor testing apparatus, generates an input signal 21a. When generating the signal, the timing correction circuit is controlled to generate the input signal 21a and adjusts timings of the input signal 21a so that phases of a leading edge of the input signal 21a and of the distributed reference clock signal 24a are exactly coincident. The timing correction circuit is also controlled to adjust the timing a trailing edge of the input signal 21a.

Next, a timing of the input signal 21b is adjusted by use of the distributed reference clock signal 24a applied in common to the input signal 21a. The timing correction circuit is controlled to generate and adjust a timing of the input signal 21b of the semiconductor testing apparatus so that a leading edge of the input signal 21b is in the same phase as the distributed reference clock signal 24a. Similarly with respect to a trailing edge, a timing correction circuit is controlled to generate and adjust a timing of the trailing edge of the input signal 21b of the semiconductor testing apparatus.

Subsequently, a timing adjustment of the reference clock signal 24b is carried out. This adjustment involves adjusting the variable delay circuit 25 in a way that keeps the input signal 24b in a state of being previously adjusted and subsequently makes the phase of the distributed reference clock signal 24b coincident with the timing of the input signal 24b. The input signal 21c as a different input is adjusted by use of the reference clock signal 24b of which the phase has been adjusted to this input signal 21b. The timing correction circuit, built in the semiconductor testing apparatus, is controlled to generate and adjust a timing of the input signal 2lc from the semiconductor testing apparatus, so that a leading edge of the input signal 21c is in the same phase as the reference clock signal 24b. Similarly with respect to the trailing edge, the timing correction circuit built in the semiconductor testing apparatus, is controlled to generate and adjust a timing of the trailing edge of the input signal 21c from the semiconductor testing apparatus, is controlled. The steps described above are hereinafter be repeated, and the reference clock signal 24c is adjusted to the input signal 21c of which the timing has already been adjusted.

Generally, the I/O section is provided in a form that extends around the periphery of the chip, and therefore it follows with the repetition of the adjustments described above that the circuit undergoing the skew adjustment last time is positioned in close proximity to the circuit that has been -timing-adjusted for the first time. Then, the timings of the two input signals are measured based on the same reference clock signal, thereby making it possible to confirm whether the timing adjustment as a whole of the system is in a normal state or not.

Each of the distributed reference clock signals 24a, 24b, 24c, . . . is supplied to two pieces of I/O buffers. This connection method schemes to make the timing skew become zero without effecting a special correction in such a way that conditions of a layout, a circuit configuration, a transistor for use and wiring are set the same at a design stage thereof. This scheme can be actualized enough by the existing process/design technique at the present. If required particularly, this timing skew quantity can be easily quantized at a development/evaluation stage. Accordingly, the same reference clock signal is inputted to two pieces of phase comparing circuits in the first embodiment, however, the number of the phase comparing circuits can be properly changed while taking into consideration a level of the timing skew accuracy required in the system, the circuit configuration, a degree of allowance in the chip area and so on.

Next, a second embodiment will be discussed referring to FIG. 3.

Figure 3:
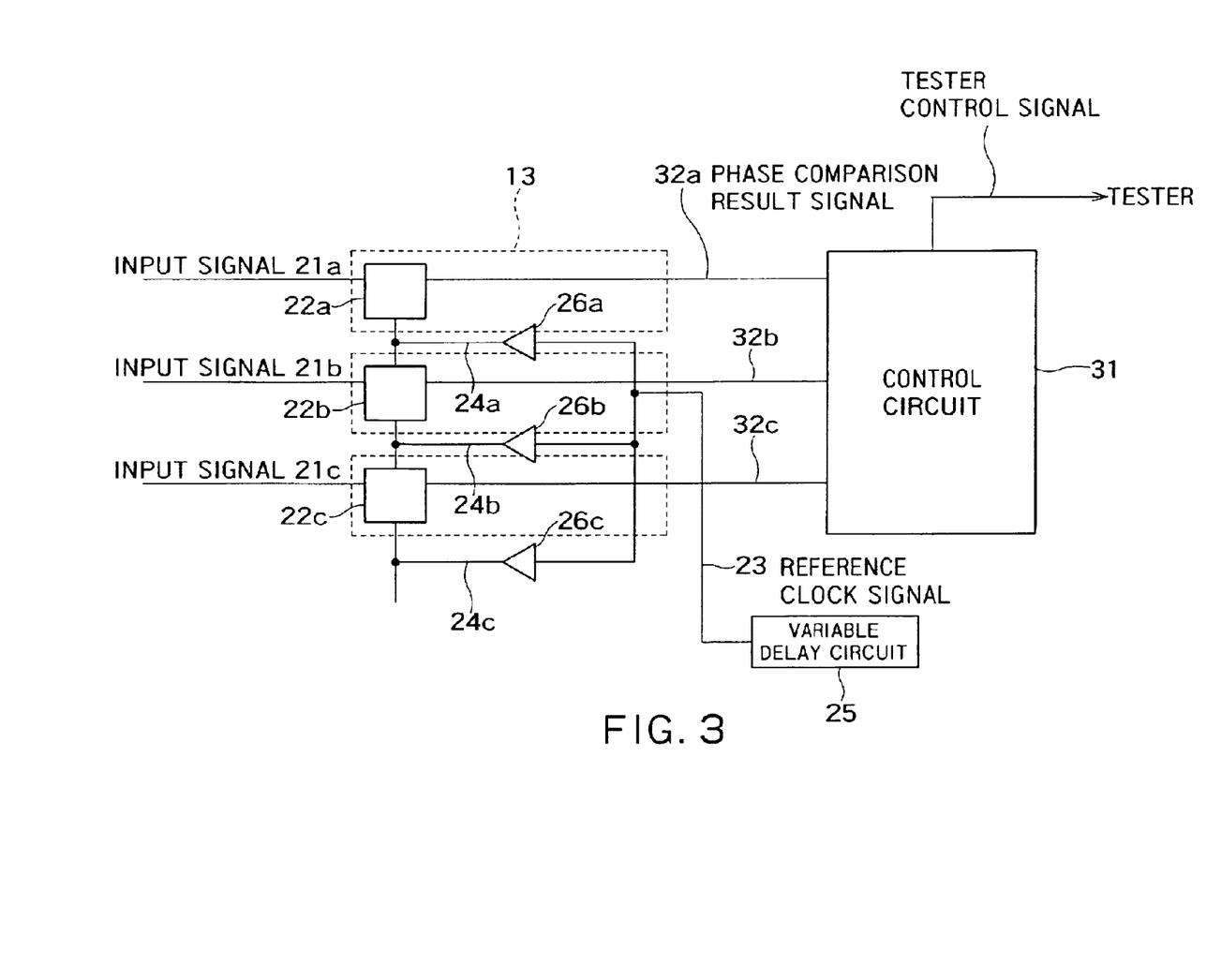
FIG. 3 is a conceptual plan view showing the I/O section of the semiconductor integrated circuit device according to a second embodiment of the present invention.

FIG. 3 is a conceptual plan view of the I/O section of the semiconductor integrated circuit device in the second embodiment, wherein the basic structure of the DUT is as shown in FIG. 1.

As illustrated in FIG. 3, according to the second embodiment, the area (I/O buffer disposing are) 18 provided with the I/O buffers 13 includes phase comparators 22a, 22b, 22c, . . . in addition to circuits serving as a normal I/O function. These comparators 22a, 22b, 22c measure timing skews between the reference clock signal 23 defined as the timing fiducial for the phase comparison and each of the plurality of input signals 21a, 21b, 21c, . . . The phase comparators 22a, 22b, 22c are generally constructed by flip-flops in which any one of the input signals 21a, 21b, 21c, . . . is set as the data input while the reference clock signal is set as the clock signal input. Or the phase comparator may be constructed using phase detectors, or the differential comparators, etc. wherein any one of the input signals 21a, 21b, 21c, . . . and the reference clock signals are set as inputs. The phase comparator 22 includes the first input for inputting the applied signal to each semiconductor integrated circuit, a second input for inputting the reference clock signal and an output for transferring phase comparison result signals 32a, 32b, 32c, . . . to the control circuit 31.

Further, the chip 10 is provided with the variable delay circuit 25 for arbitrarily adjusting the reference clock signal fiducial for the phase comparison and the timing of the reference clock signal. The variable delay circuit 25 is provided with wirings connected to the second input of each of the phase comparators 22a, 22b, 22c. The reference clock signal 23 of which the timing has been arbitrarily adjusted, is outputted via this wiring from the variable delay circuit 25 and is thereafter inputted to the respective phase comparators 22a, 22b, 22c as distributed reference clock signals 24a, 24b, 24c, . . . distributed to reach at the same time. Each distributed reference clock signal, for example, 24a is supplied through the wiring so as to be inputted to two pieces of phase comparators 22a, 22b. The chip is further provided with the control circuit 31. The control circuit 31 is connected to each of the phase comparators 22a, 22b, 22c and to the variable delay circuit 25 and further is connected to the semiconductor testing apparatus (tester).

The second embodiment has a structure of having the built-in control circuit, as an addition to the configuration in the first embodiment in order to execute the step of measuring and correcting the timing skew on the basis of a concept of BIST (Built-In Self Test).

An initializing signal is inputted to the control circuit 31 from the semiconductor testing apparatus (tester) etc., thereby initializing this control circuit. At the same time, this initializing signal initializes the phase comparators 22 and the variable delay circuit 25. Next, upon an input of a start signal, timings are measures sequentially from a specified input signal. A target input signal 21a is applied to the first input of the phase comparator 22a from the semiconductor testing apparatus etc., the reference clock signal 23 is transmitted at the same time from the variable delay circuit 25, and the distributed reference clock signal 24a, among the distributed reference clock signals into which the reference clock signal 23 are distributed so as to reach at the same time, is applied to the phase comparator 22a. Then, the phase comparison result signal 32a thereof is inputted to the control circuit 31, thereby performing the control to determine a next operation of the whole system.

If the specified timing skew specifications are not met, the semiconductor testing apparatus is commanded to make a fine adjustment of the timing correction circuit, built in the semiconductor testing apparatus, for a skew calibration target input signal, or to make a fine adjustment of the variable delay circuit 25, built in the DUT, for adjusting the timing of the reference clock signal.

These operations are carried out for the timing correction target signal defined in the steps described in the first embodiment. Thereafter, the target input signal 21b is likewise applied to the first input of the phase comparator 22b from the semiconductor testing apparatus, then the reference clock signal 23 is transmitted from the variable delay circuit 25, and the distributed reference clock signal 24b is applied to the phase comparator 22b. The phase comparison result 32b is inputted to the control circuit 31 from the phase comparator 22b. This operation is repeated, and, if capable of judging that the specified timing skew specifications are reached, the target signal is changed to the next.

With this repetition, the circuit that is skew-adjusted last time is positioned in close proximity to the circuit which has been timing-adjusted for the first time, and the timings of the two input signals are measured base on the same reference clock signal, whereby whether the timing adjustment of the whole system is in the normal state or not can be confirmed.

Next, a third embodiment will be discussed referring to FIG. 4.

Figure 4:
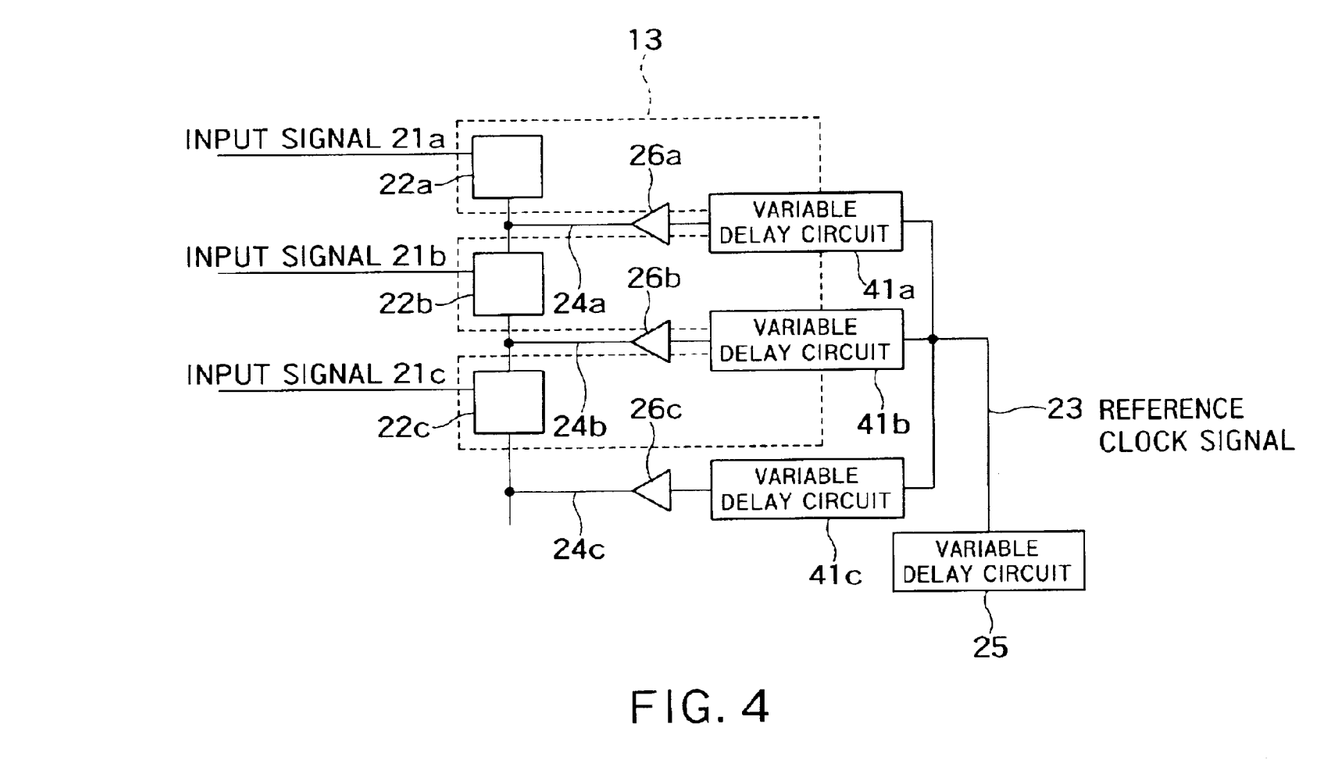
FIG. 4 is a conceptual plan view showing the I/O section of the semiconductor integrated circuit device according to a third embodiment of the present invention.

FIG. 4 is a conceptual plan view of the I/O section of the semiconductor integrated circuit device in the third embodiment, wherein the basic structure of the DUT is as shown in FIG. 1. As illustrated in FIG. 4, according to the third embodiment, the area (I/O buffer disposing area) 18 provided with the I/O buffers 13 includes phase comparators 22a, 22b, 22c, . . . for making a comparison of timings of the two signals in addition to the circuit defined as a normal I/O function. This comparator 22 measures a timing skew between the reference clock signal 23 defined as the timing fiducial for the phase comparison and each of the plurality of input signals 21a, 21b, 21c, . . . The phase comparator 22 is generally constructed of the flip-flop in which any one of the input signals 21a, 21b, 21c, . . . is set as the data input while the reference clock signal is set as the clock signal input, or of the phase detector, the differential comparator etc. wherein any one of the input signals 21a, 21b, 21c, . . . and the reference clock signal are set as inputs. The phase comparator 22 includes the first input for inputting the applied signal to each semiconductor integrated circuit, and a second input for inputting the reference clock signal.

Further, the chip 10 is provided with the variable delay circuit 25 for arbitrarily adjusting the reference clock signal fiducial for the phase comparison and the timing of the reference clock signal. This variable delay circuit 25 is disposed in an arbitrary position of the central area provided with the semiconductor integrated circuit 14, or the peripheral area 16 etc. on the chip 10. Then, the variable delay circuit 25 is provided with wirings connected to the second input of each of the phase comparators 22a, 22b, 22c. The reference clock signal 23 of which the timing has been arbitrarily adjusted, is outputted via this wiring from the variable delay circuit 25 and is thereafter inputted to the respective phase comparators 22 as distributed reference clock signals 24 (24a, 24b, 24c, . . . ) distributed to reach at the same time. Further, variable delay circuits 41a, 41b, 41c each capable of arbitrarily adjusting the timing thereof independently per phase comparator, are interposed between the variable delay circuit 25 and the phase comparators 22a, 22b, 22c. Each distributed reference clock signal, e.g., 24a is supplied to two pieces of phase comparators e.g., 22a, 22b. Note that the buffers 26a, 26b, 26c are inserted in the wirings in the third embodiment but does not affect the circuit function. Accordingly, according to this embodiment of the present invention, this buffer may not be inserted, or a plurality of buffers may also be inserted therein Note that the phase comparator 22 is disposed in the I/O buffer disposing area 18 and can be also disposed in whatever position on the chip according to the present invention. The phase comparator 22 maybe provided and disposed in an arbitrary area having a room in space on the chip.

In the third embodiment, the variable delay circuit is individually provided for the reference clock signal inputted to each of the phase comparators, whereby the processing can be effected in parallel between the phase comparators. To be specific, the measuring/correcting process of the timing skew, which has been described in the first embodiment, can be executed in, for example, the following steps. The timing correction circuit, built in the semiconductor testing apparatus, for generating and adjusting the timing of the leading edge of the input signal 21b of the semiconductor testing apparatus, is controlled so that the leading edge of the signal applied to the input signal 21b from the semiconductor testing apparatus etc. becomes exactly coincident with the phase of the reference clock signal 24b. Similarly with respect to the trailing edge, the timing correction circuit for generating and adjusting the timing of the trailing edge of the input signal 21b of the semiconductor testing apparatus, is controlled.

Next, delay information of the variable delay circuit 41a for adjusting the timing of the input signal 21c by use of the distributed reference clock signal 24b and also adjusting the timing of the input signal 21b, is controlled. Thus, the parallel processing can be attained by providing signal lines after being branched off with the variable delay circuit 41b for determining a delay of the distributed reference clock signal 24b for the timing adjustment of the input signal 21c, and with the variable delay circuit 41a for determining a delay of the distributed reference clock signal 24a for the timing adjustment of the input signal 21a, individually independently, thereby making it feasible to reduce a time of executing the timing correction process as a whole. Incidentally, it is advantageous to use the variable delay circuit 41 which is smaller both in resolution and in variable width than the variable delay circuit 25.

Next, a fourth embodiment will be explained referring to FIG. 5.

Figure 5:
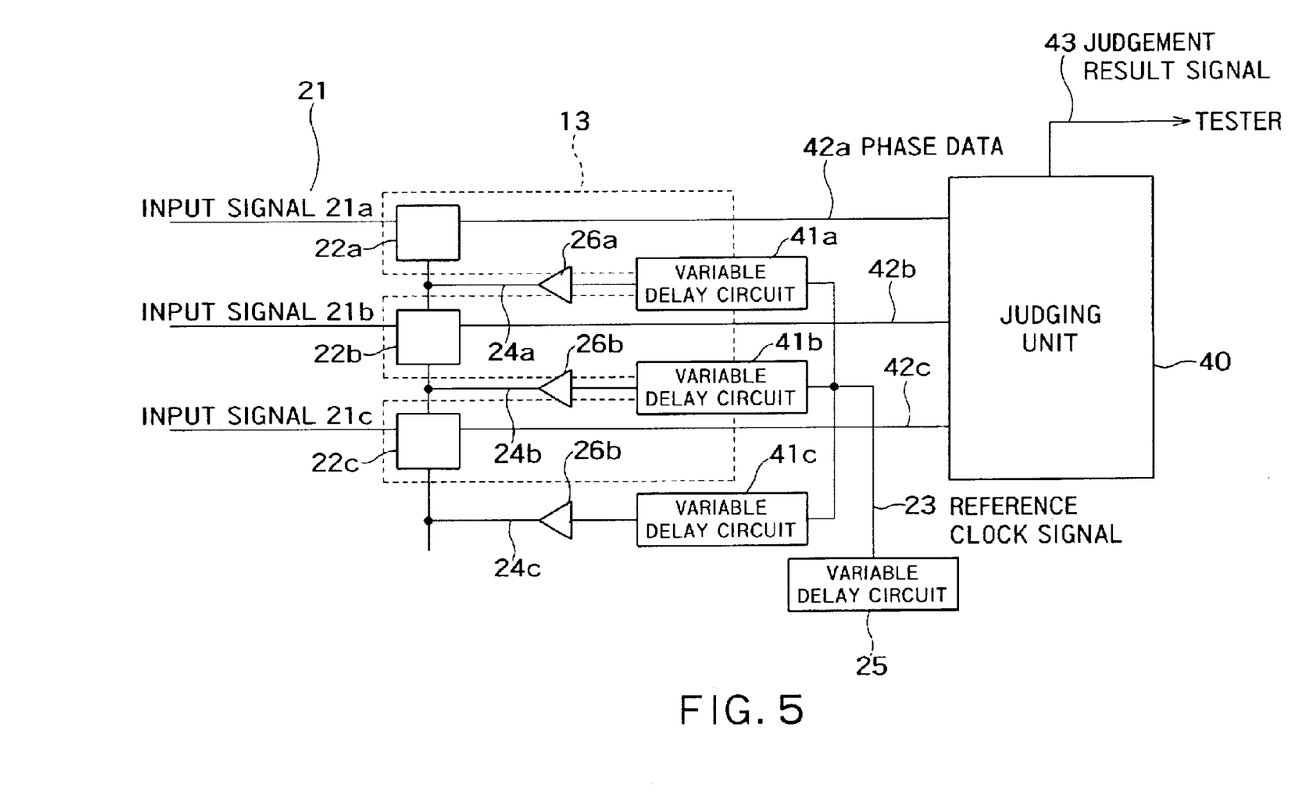
FIG. 5 is a conceptual plan view showing the I/O section of the semiconductor integrated circuit device according to a fourth embodiment of the present invention.

FIG. 5 is a conceptual plan view of the I/O section of the semiconductor integrated circuit device in the fourth embodiment. The basic structure of the DUT is as shown in FIG. 1. The fourth embodiment is characterized by having a judging unit. Other configurations are the same as those in the fourth embodiment. Namely, the judging unit 40 has a structure that this judging unit 40 is connected to the phase comparator 22, receives pieces of phase data 42a, 42b, 42c, . . . from the phase comparators 22, and sends a judgement result 43 to the semiconductor testing apparatus (tester).

The fourth embodiment has a scheme applied when confirming, after effecting the skew calibration, a state of how much the accuracy thereof is kept. To be specific, at a stage of completing the execution of the skew calibration, there comes a state where the paired input signals are in phase with the reference clock signal. This can be attained in a case where the variable delay circuit explained in the third embodiment is provided independently for every distributed reference clock signal. In this case, the signals are applied to all the inputs or a specified single input or a plurality of inputs at the same specified timing as executing the skew calibration, and a signal generation timing of the variable delay circuit 25 is, with a phase-difference-zero setting (which is a state after completing the skew calibration) being centered, consecutively changed in its anterior and posterior with a predetermined set resolution.

Idealistically, an edge timing can be detected with a center value where the phase difference comes to zero. On an actual basis, however, it follows that a scatter occurs before and after the skew caused due to changes in ambient environment after executing the skew calibration and influences of a temperature of a power-source/device junction inside the semiconductor testing apparatus, and so forth. This edge detection timing fluctuates corresponding to a certain set resolution in the anteriority and posteriority of the setting of the center value where the phase difference comes to zero, and degree of hot much the detection timing fluctuates in anteriority and posteriority thereof is defined as a timing skew (scatter). It is possible to judge from comparing the result of the measurement with judgement specifications whether the state of keeping the timing accuracy of the semiconductor testing apparatus is good (acceptable) or no good (unacceptable). Actually, this judgement can be also attained during a test for the DUT. Namely, a timing skew check can be executed immediately before implementing a test item such as a function test etc., and the check can be properly done by setting the variable delay circuit 25, at the most critical point of the timing during the actual function test, so that the phase difference with respect to an edge thereof becomes zero, and by making the phase comparison between the input timing edge thereof and the reference clock signal.

On this occasion, a method of consecutively changing the edge timing of the reference clock signal involves utilizing the variable delay circuit built in the DUT, as a unit for finely adjusting the reference timing, or utilizing the variable delay circuit 41 provided individually for every distributed reference clock signal, or can involve the use of a method of having the delay process already done when applied to the reference clock signal from the semiconductor testing apparatus, and so on.

According to the fourth embodiment, the mass production/evaluation can be performed with a proper measurement accuracy by executing the process in accordance with a predetermined corresponding-to-inconvenience routine such as re-executing the skew calibration of the semiconductor testing apparatus on the basis of judging whether the state of keeping the timing accuracy of the semiconductor testing apparatus is good or bad.

Next, a fifth embodiment will be discussed.

Figure 6:
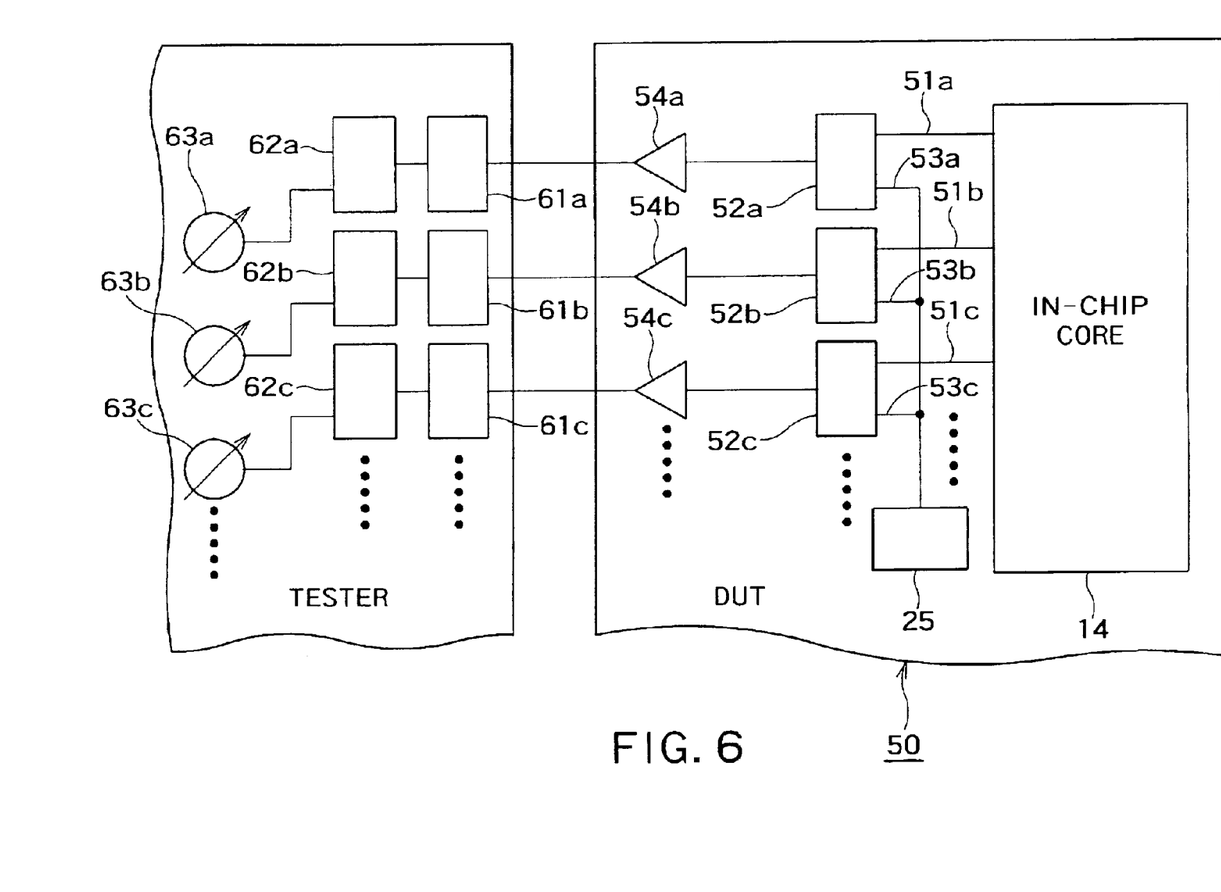
FIG. 6 is a conceptual plan view showing the I/O section of the semiconductor integrated circuit device according to a fifth embodiment of the present invention.

The fifth embodiment has a characteristic of providing, e.g., a logic level transition circuit in the buffer disposing area 18 shown in FIG. 1. Herein, a method of executing the skew calibration on the side of the output signal of the DUT, will be explained.

FIG. 6 shows a DUT according to an embodiment of the present invention using the logic level transition circuit. In this DUT 50, Output signals 51a, 51b, 51c, . . . from the in-chip core 14 are supplied to logic level transition circuits 52a, 52b, 52c, . . . To these logic level transition circuits 52a, 52b, 52c, . . . , reference clock signals 53a, 53b, 53c, . . . which have been generated the variable delay circuit 25 are also supplied. The reference clock signals serve as trigger signals, whereby a pin-to-pin skew of the output timing is made zero by completely matching the phases of the respective output signals with each other. Signals outputted from this DUT through buffers 54a, 54b, 54c, . . . are inputted to comparators 61a, 61b, 61c, . . . then to timing judging circuits 62a, 62b, 62c in the semiconductor test apparatus.

Since skew correction circuits 63a, 63b, 63c adjust strobe signals for the timing judging circuits 62a, 62b, 62c, it is possible to execute the skew calibration of the output judging time of the DUT on the side of the comparator with respect to all the outs and all the edges.

What herein needs paying attention is that the skew between the reference clock signal used for the phase comparator for judging the signal application timing for the DUT explained in the first through fourth embodiments discussed above and the reference clock signal of the logic level transition circuit explained in the fifth embodiment, is zero, and that a propagation delay time till the signal from the reference clock signal of the logic level transition circuit is actually outputted from the DUT, is the same between the respective output signals.

Figure 7:
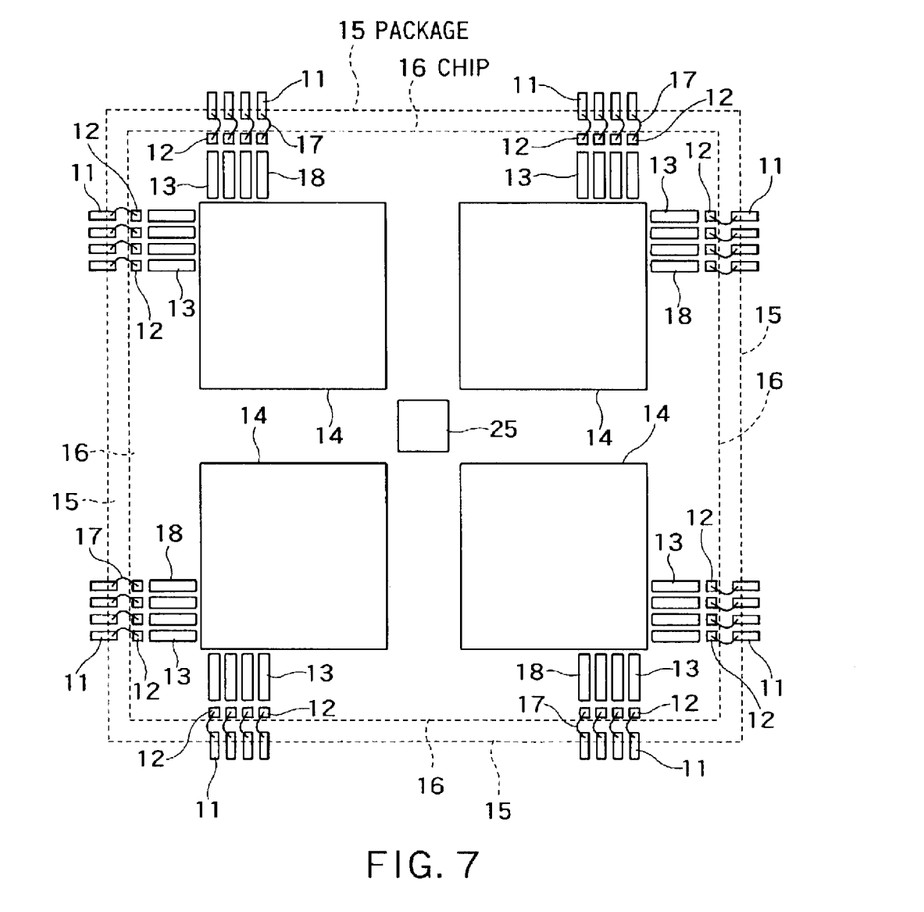
FIG. 7 is an explanatory plan view showing an interior of a package of a semiconductor integrated circuit device according to a sixth embodiment of the present invention.

FIG. 7 is an explanatory plan view showing an interior of a package of a semiconductor integrated circuit device according to a sixth embodiment of the present invention.

According to this embodiment, the semiconductor device has four in-chip cores, and each in-chip core has the same circuits as shown in FIG. 2 in the I/O buffer disposing area. However, the variable delay circuit can be commonly used, only one variable delay circuit 25 is provided in the center area of the semiconductor device. In this embodiment, space efficiency is improved.

Next, methods of effectively utilizing the present invention will now be discussed. In the case of measuring the same measurement target semiconductor integrated circuit in a state of being mounted in a different type of semiconductor testing apparatus and in an actual system, a measurement result (an AC timing margin of a setup/hold/propagation delay time etc.) differs due to a difference in the system environment outside the DUT, and it is difficult to take a correlation. In such a case, a timing correlation at the DUT end can be taken by utilizing a testing circuit built in the DUT according to the present invention, and the correlation of the measurement results of the DUT can be taken by correcting a correlation difference in the system environment outside the DUT. In the case of implementing the calibration of a difference between types of testers by use of, e.g., a calibration device, the calibration can be executed based on the correlation data, genuinely, about only the system environment in the form of eliminating device characteristics. Further, there is eliminated the necessity for the complicated management of the calibration device and the management of the individual data thereof.

Even in the state of being mounted in the actual system, the timing skew occurred in the system can be measured by use of the testing circuit of the present invention. This measurement of the timing skew can be executed on the implementation of the skew calibration conducted on the semiconductor testing apparatus by assigning a function of generating a signal for testing to a different semiconductor integrated circuit connected to the semiconductor integrated circuit having the built-in testing circuit of the present invention, wherein a so-called real-device debug is of course facilitated, and, if the timing margin declines due to a variety of factors in terms of designing, manufacturing etc., it is possible to obtain skew data for improving the timing margin and to perform a feedback of the whole system.

As described above, according to the embodiments of the present invention, the skew at the DUT end can be precisely corrected by performing the timing calibration at a high accuracy on the basis of the DUT end in the semiconductor testing apparatus. Especially, the complete skew calibration for both of the input signal and the output signal can be attained with respect to all the pins as the DUT skew calibration performing targets.

Further, a unit for keeping and managing the timing accuracy can be provided.

Moreover, it is possible to provide the semiconductor integrated circuit device capable of confirming the timing accuracy of the input signal from the semiconductor testing apparatus in the state where the semiconductor testing apparatus actually performs the test, and also the method of testing this semiconductor integrated circuit device.

It is also feasible to implement the necessary correction by taking the timing correlation between the different types of semiconductor testing apparatus as well as on the system (the DUT user system board) where the DUT is actually used.

According to the embodiments of the present invention, it is possible to precisely correct a skew at a DUT end by incorporating a skew calibration testing circuit into a DUT. The built-in testing circuit corrects a measurement system so that measurement results of the timing skew become the same in a plurality of circuits provided for every signal pin of the DUT. The testing circuit provided between different signal pins has a contrivance that the measurement results of the timing skew become the same without correcting the measuring system by setting the same a variety of conditions of a layout, a circuit configuration, a transistor for use and a wiring so that the skew occurred due to a process factor of the DUT, a power source voltage factor, a temperature factor, a physical design factor etc. comes to zero. In the same way with the input signal to the DUT, the testing circuit is built in a signal generation circuit with respect to also an output signal from the DUT, a signal idealistically having zero of the skew is sent from an output pin of the DUT, and the skew calibration can be attained by correcting a timing of a signal judgment by use of a comparator of a semiconductor testing apparatus.

This architecture makes it feasible to attain the complete skew calibration for both of the input signal and the output signal with respect to all the skew calibration execution target pins of the DUT by performing a chain of the skew calibrations.

Further, the timing accuracy of the input signal from the semiconductor testing apparatus can be confirmed in a state where the semiconductor testing apparatus actually performs the test by providing the testing circuit within the DUT and making a comparative judgement in a way that sets corrected by the skew calibration as a reference.

What is claimed is:

1. A semiconductor integrated circuit device comprising:
   a semiconductor substrate on which a semiconductor chip is provided;
   a plurality of phase comparators, provided on said semiconductor substrate, with input signals to said semiconductor integrated circuit from outside serving as one inputs thereof; and
   a variable delay circuit, provided on said semiconductor substrate, configured to adjust a timing of a reference clock signal which is used for a phase comparison;
   wherein distributed reference clock signal signals into which the reference clock signal is distributed so as to reach at the same time said plurality of phase comparators, are set as the other inputs of said phase comparators.

2. The semiconductor integrated circuit device according to claim 1, wherein said comparators and said variable delay circuit are provided in an area for input/output buffers.

3. The semiconductor integrated circuit device according to claim 1, wherein each of said distributed reference clock signals is provided to two phase comparators which disposed adjacent.

4. The semiconductor integrated circuit device according to claim 1, further comprising a control circuit configured to automatically execute a timing calibration process by operating in unification said phase comparators provided on said semiconductor substrate and said variable delay circuit for arbitrarily adjusting the timing of the reference clock signal as a standard for the phase comparison.

5. The semiconductor integrated circuit device according to claim 1, further comprising a variable delay circuit configured to adjust the timing of the reference clock signal inputted for the phase comparison independently per said phase comparator.

6. The semiconductor integrated circuit device according to claim 1, further comprising condition judging means, provided on said semiconductor substrate, for judging a condition with respect to a phase difference.

7. The semiconductor integrated circuit device according to claim 1, further comprising a logical level transition circuit configured to control an output signal from said semiconductor integrated circuit at a timing of the reference clock signal.

8. The semiconductor integrated circuit device according to claim 1, wherein a plurality of said semiconductor chips are provided on said semiconductor substrate, and said variable delay circuit is commonly used among said plurality of semiconductor chips.

9. The semiconductor integrated circuit according to claim 1, wherein said variable delay circuit is disposed in center area of said semiconductor substrate.

* * * * *